US005754607A

United States Patent [19]

Powell et al.

[11] Patent Number: 5,754,607
[45] Date of Patent: May 19, 1998

[54] METHOD AND APPARATUS FOR ACHIEVING FAST PHASE SETTLING IN A PHASE LOCKED LOOP

[75] Inventors: William E. Powell; David T. Hayes, both of Raleigh, N.C.

[73] Assignee: Alcatel Network Systems, Inc., Richardson, Tex.

[21] Appl. No.: 439,091

[22] Filed: May 10, 1995

[51] Int. Cl.[6] .................................................. H03D 3/24
[52] U.S. Cl. ...................... 375/373; 375/375; 375/376; 327/156; 331/17; 331/27; 331/DIG. 2
[58] Field of Search ..................... 375/373, 375, 375/376; 327/105, 156; 331/1 A, 10, 15, 16, 17, 25, DIG. 2; 370/100.1, 105.3

[56] References Cited

U.S. PATENT DOCUMENTS 4,792,768  12/1988  Fried et al. .................. 331/16
4,937,536  6/1990  Reinhardt et al. .................. 331/17
5,148,123  9/1992  Ries .................. 375/376
5,473,285  12/1995  Nuckolls et al. .................. 327/156

Primary Examiner—Don N. Vo
Attorney, Agent, or Firm—Baker & Botts, L.L.P.

[57] ABSTRACT

A method and an apparatus are provided to achieve fast phase settling when a reference signal for a phase locked loop changes from a first frequency to a second frequency, such as during holdover recovery in a synchronous optical network. The present method acquires the second frequency with a phase locked loop (24). After the frequency is acquired, the integral register (39) of the phase locked loop (24) is loaded with the contents of the output frequency register (34) of the phase locked loop (24). The phase detector (28) of the phase locked loop (24) is then realigned to the reference signal.

22 Claims, 2 Drawing Sheets

1

METHOD AND APPARATUS FOR ACHIEVING FAST PHASE SETTLING IN A PHASE LOCKED LOOP

TECHNICAL FIELD OF THE INVENTION

This invention relates generally to achieving phase settling for a phase locked loop upon a frequency change in the reference signal, and more particularly, to a method and apparatus for achieving fast phase settling during the clock holdover recovery period in a synchronous optical network.

BACKGROUND OF THE INVENTION

One high speed network used in modern telephone systems is known as a Synchronous Optical Network (SONET). Signals carried on this high speed optical network typically include a number of lower speed signals, known as payload signals, multiplexed together. Multiplexed payload signals are combined with an optical carrier signal for transmission over the network.

A synchronous optical network typically includes two or more network elements connected by a fiber optic transmission medium. A network element ordinarily may receive and transmit payload signals as well as multiplex and demultiplex payload signals for transmission over SONET. These network elements usually generate an optical carrier and synchronize that carrier to some external synchronization reference signal. Synchronization signals available from the network providers' synchronization network are often used as the reference signal for synchronization.

Network synchronization quality has recently become recognized as critical to SONET payload jitter and wander performance. Phase changes on payloads can either be rapid (jitter) or slow (wander), but are usually undesirable, especially when caused from external synchronization references. Payload jitter and wander may be caused through the asynchronous bit-stuffing (mapping) mechanism, for example, by phase changes to the optical carrier signal. Performance of individual network element clocks, therefore, may contribute significantly to overall payload transport performance (phase stability) as well as synchronization distribution quality. SONET payload signals are highly sensitive to phase changes on the optical carrier that may occur at various network elements.

One particular time at which phase drift in the optical carrier may occur is during holdover recovery. When a network element loses the synchronization reference signal used to generate the optical carrier, the network element clock enters a mode known as the holdover mode. In holdover mode, the network element clock continues to try to operate at the frequency at which it was transmitting when the synchronization reference signal was lost. The network element will then strive to maintain this frequency during holdover. To maintain this frequency, however, the feedback in the phase locked loop used to generate the network element clock is disabled, since there is no longer an external synchronization reference available. If it were not disabled, the phase locked loop would quickly move off frequency from the previously generated synchronized transmit rate. However, with the feedback disabled and no external synchronization reference, the frequency of the network element clock may drift due to, for example, temperature and aging effects of the unsynchronized oscillator.

When the network element emerges from holdover mode upon return of the synchronization reference signal, the network element clock output frequency may have errors in both frequency and phase. Without a method to achieve fast phase settling during this holdover recovery period, excessive maximum time interval error (MTIE) and phase drift may be added to the optical carrier phase, and to payloads and transported synchronization signals.

SONET network elements typically use a phase locked loop to synchronize the optical carrier with the network synchronization reference signal. Because phase locked loops normally used in SONET network elements have slow response times to phase changes, significant phase drift or MTIE may occur on the network element clock output during holdover recovery.

SUMMARY OF THE INVENTION

Accordingly, a need has arisen for a method and apparatus for achieving fast phase settling when the frequency of a phase locked loop changes from a first frequency to a second frequency. The present invention achieves fast phase settling to the desired output frequency during holdover recovery of a phase locked loop. The phase locked loop considered here is a second order phase locked loop. In accordance with the present invention, when the reference signal input to a phase locked loop changes from one frequency to a second frequency, the phase locked loop locks on or acquires the second frequency and moves from the first frequency to the second frequency. After the second frequency has been acquired, the integral register counter of the phase locked loop may be loaded with the contents of an output frequency register. The phase detector of the phase locked loop is then realigned to the reference signal (or zero on the new reference signal), which locks in a relative phase difference between the input synchronization reference and the output clock phase.

One important technical advantage of the present invention is that fast phase settling may be achieved in spite of a frequency change, which reduces phase drift at the output of a phase locked loop over time. The invention improves holdover recovery performance of a network element clock by significantly reducing the long term phase drift from tens or hundreds of microseconds down to nanoseconds after frequency acquisition during the holdover recovery period. Recovery times are also reduced from many thousands of seconds down to typically less than 100 seconds depending upon both the loop bandwidth during frequency acquisition phase, and the specific frequency acquisition algorithm used.

BRIEF DESCRIPTION OF THE DRAWINGS

For a more complete understanding of the present invention and the advantages thereof, reference is now made to the following descriptions taken in conjunction with the accompanying drawings in which.

DETAILED DESCRIPTION OF THE INVENTION

Figure 1:
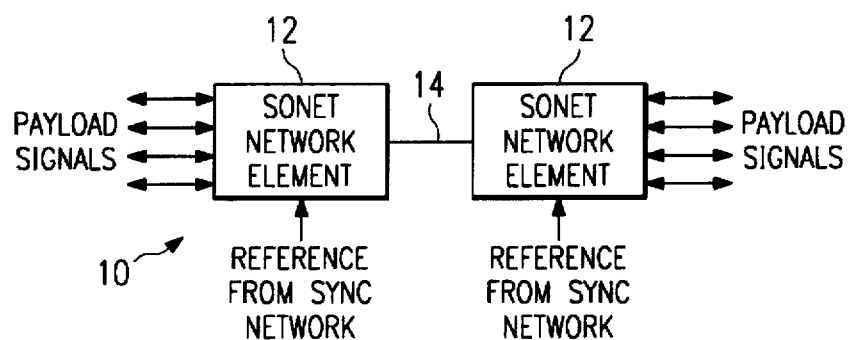
FIG. 1 illustrates a portion of a synchronous optical network in which the present invention may be used.
Figure 2A:
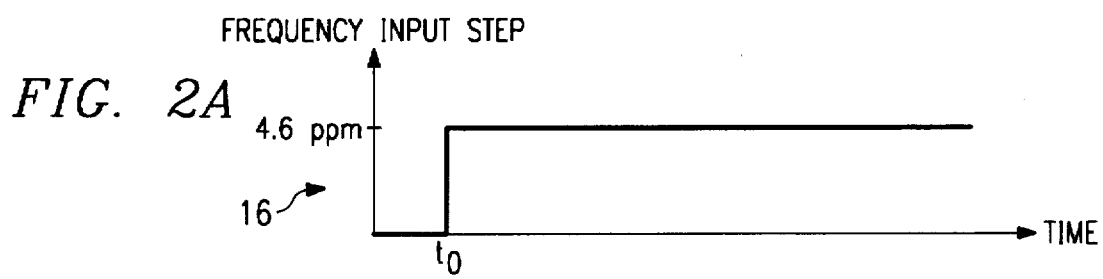
FIGS. 2A, 2B and 2C illustrate typical frequency and phase responses of a phase locked loop to a frequency step on the input reference signal in a SONET network element clock.
Figure 2B:
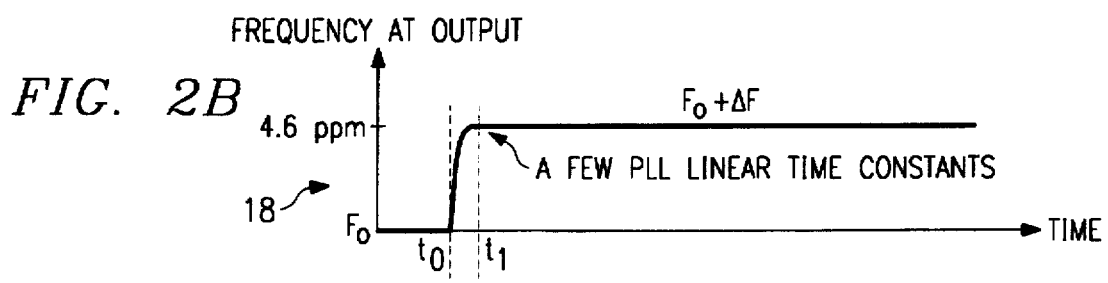
Figure 2C:
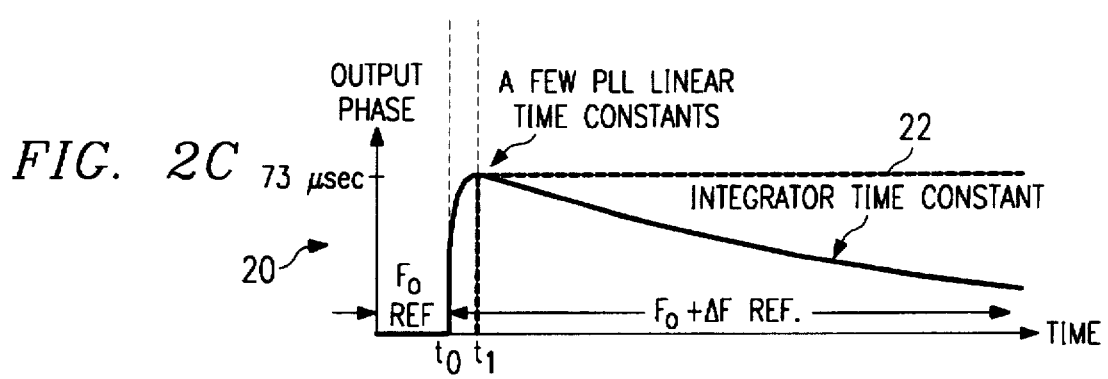
Figure 3:
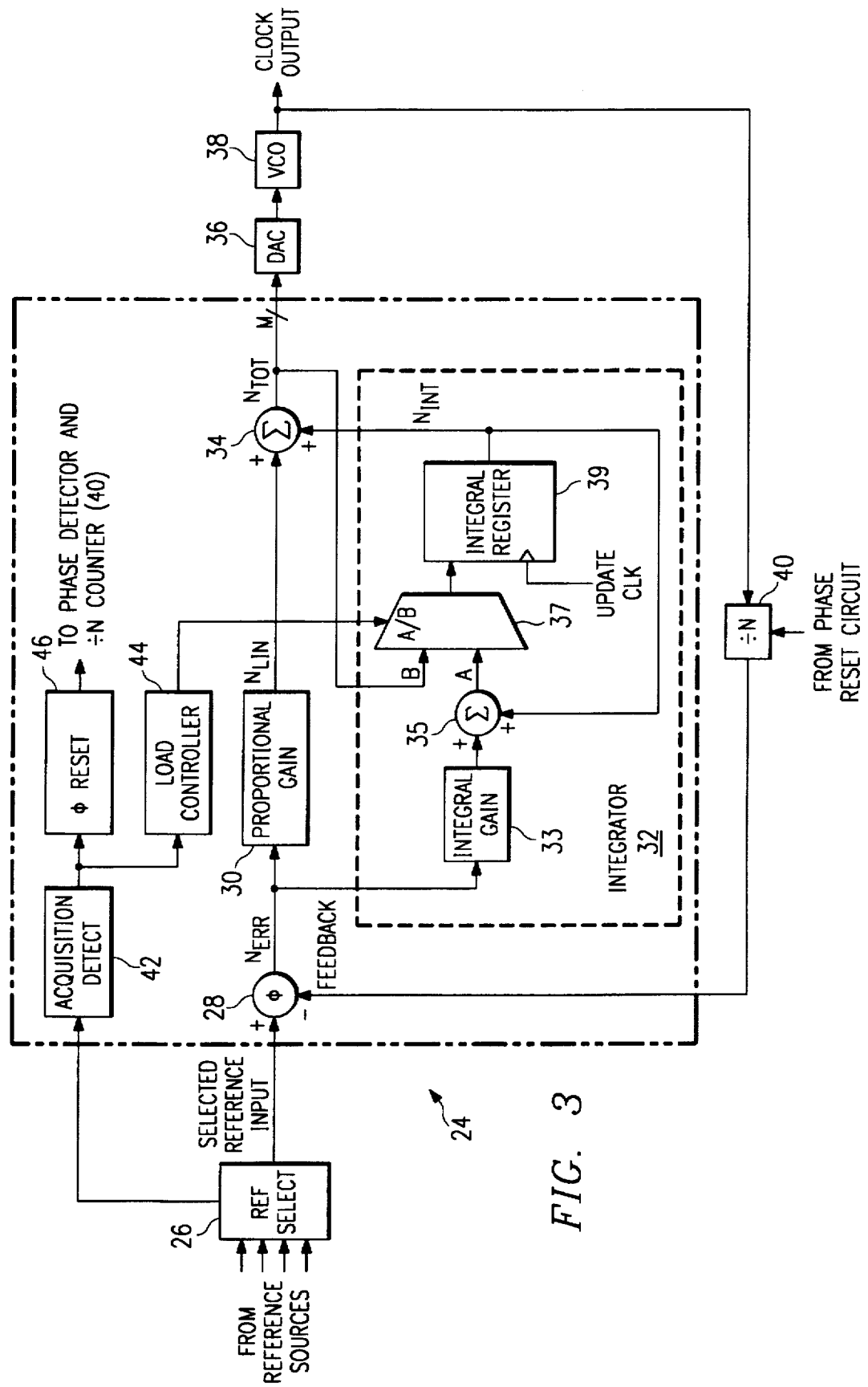
FIG. 3 illustrates an embodiment of a phase locked loop constructed in accordance with the teachings of the present invention.

The present invention and its advantages are best understood by referring to FIGS. 1–3 of the drawings, like numerals being used for like and corresponding parts of the various drawings.

FIG. 1 illustrates a portion of a synchronous optical network 10 (SONET). Network 10 comprises network elements 12 and fiberoptic transmission medium 14. For a preferred embodiment, the present invention will be described in the context of network 10. The invention, however, may be used in any application in which fast phase settling is desirable when the reference signal input to a phase locked loop changes frequency.

In this embodiment, network elements 12 receive payload signals from one or more sources (not explicitly shown). Network elements 12 can multiplex or demultiplex payload signals and can form a higher bandwidth signal for transmission over fiberoptic transmission medium 14. The higher bandwidth signal normally comprises a plurality of multiplexed payload signals with an optical carrier. Network elements 12 can also be connected using additional fiberoptic transmission media 14 to other network elements 12. Network elements 12 synchronize the optical carrier to a synchronization reference signal received from a network provider synchronization network. Other synchronization reference signals can also be used, such as, for example, another SONET signal.

Each network element 12 in this embodiment generates its optical carrier transmit frequency based on the output frequency of its network element clock. The network element clock signal is generated using a phase locked loop that receives a synchronization network signal or other SONET optical signal as a reference. To allow the cascading of a reasonable number of network elements 12 in series, network element clocks typically are designed for low phase gains, which are typically less than 0.1 dB. Coupled with synchronization filtering bandwidth requirements typically below 0.01 Hz, long time constants are normally used for updating the frequency estimate of the synchronization reference input signal that the network element clock typically retains in the integral register of its PLL.

A typical SONET network element clock has a linear time constant of:

$$\tau_{LIN} = \frac{1}{2\pi \cdot BW} \quad (1)$$

where BW equals the loop low-pass filtering bandwidth. For a clock with a 0.01 Hz low-pass filtering bandwidth, $\tau_{LIN}$ would be 16 seconds. The integrator time constant would be:

$$\tau_{INT} = (1+(2\xi)^2) \cdot \tau_{LIN} \quad (2)$$

where $\xi$ equals the PLL loop damping factor. A typical damping factor of 7 results in approximately a 0.05 dB loop phase gain for a second-order phase locked loop, and an integrator time constant of approximately 3100 seconds for a 0.01 Hz bandwidth loop.

When a phase locked loop experiences a frequency step, as typically occurs during the holdover recovery period, the loop moves to the new frequency relatively quickly—within a few linear loop time constants. However, the frequency estimate of the loop (represented in the loop integral register) hardly moves at all during this time. A significant phase offset is created at the phase detector to help create a count offset that moves the loop to the correct frequency, even though the loop integral register, which retains the frequency estimate, has barely changed. This phase offset will gradually be reduced as the loop integrator register slowly moves to the correct frequency estimate to track the input reference frequency. This can take hours for a low bandwidth loop and can cause significant phase drift or MTIE on the clock output.

The typical peak phase change (MTIE) performance ($\phi_{PK}$) of a clock with an input frequency change of $\Delta f$ is:

$$\phi_{pk} = \frac{\left(\frac{\Delta f}{f}\right)}{2\pi \cdot BW} \quad (3)$$

where $\Delta f/f$ represents the loop fractional frequency change, typically expressed in parts per million (ppm) and BW represents the phase locked loop bandwidth.

FIGS. 2A, 2B and 2C illustrate three graphs 16, 18, & 20 that depict the response of a typical network element clock phase locked loop to a frequency input step of 4.6 ppm. Graph 16 depicts the frequency of the input reference signal and illustrates a fractional frequency step of 4.6 ppm occurring at time $t_0$. Graph 18 illustrates the frequency vs. time response of the output of the phase locked loop (the network element clock) to the input frequency step. Graph 20 illustrates the phase response of the output of the phase locked loop to the input step.

For a frequency step of 4.6 ppm ($4.6 \times 10^{-6}$) and a loop bandwidth of 0.01 Hz, a peak phase movement of the loop of 73 μsec would occur after the frequency step, relative to the new reference frequency. The phase locked loop moves to the new frequency relatively quickly—in a few linear time constants (i.e., 30–60 sec. in this example). This limits the peak phase difference to 73 μsec. Settling to a final relative zero phase difference, however, takes much longer.

To settle from a 73 μsec peak phase MTIE to within 100 ns of the final phase takes about 7 integrator time constants, or about 22K sec (approximately 6 hours). This time could be reduced by raising the loop bandwidth and/or lowering the integrator time constant. These actions, however, would degrade payload jitter and synchronization transport performance and cause significant phase gain and instability in a cascade of network element clock phase locked loops.

FIG. 3 illustrates an embodiment of a digital phase locked loop 24 constructed in accordance with the teachings of the present invention. Phase locked loop 24 includes reference select circuit 26 that allows the selection of multiple reference signals for phase locked loop 24. Reference select circuit 26 can be omitted from phase locked loop 24 where only one reference signal for phase locked loop 24 is being used.

Phase locked loop 24 further comprises phase detector 28, proportional gain circuit 30, integrator 32, summer 34, digital to analog converter 36, voltage controlled oscillator 38 and divider 40. The integrator 32 is further comprised of integral gain circuit 33, summer 35, multiplexer 37 and integral register 39. Divider 40 could be omitted if the output of phase locked loop 24 has the same frequency as the reference signal input to phase detector 28. Summer 34 may also serve as an output frequency register. The combination of digital to analog converter 36 and voltage controlled oscillator 38 can also be replaced by a digitally controlled oscillator, or an oscillator that generates incremental frequency changes in response to numerical input changes with arbitrarily small steps using numerical techniques. For example, an oscillator such as that described in U.S. patent application Ser. No. 08/074,108, entitled "Synchronized Clock Using a Non-pullable Reference Oscillator" can be used. The various blocks of phase locked loop 24 may be implemented using hardware or software.- In this embodiment, each of the circuit blocks enclosed by the dashed line can be implemented by a combination of a microprocessor using software and counters for the phase detector. Hardware implementations could also be used for one or more of these circuit blocks.

Phase locked loop 24 further comprises acquisition detector 42, load controller 44 and phase reset circuit 46. Acquisition detector 42 connects to reference select 26, load controller 44 and phase reset circuit 46. Load controller 44 connects to integrator 32, while phase reset circuit 46 connects to phase detector 28 and counter 40. The functions of acquisition detector 42, load controller 44 and phase reset circuit 46 will be described in connection with the operation of phase locked loop 24 when the reference input to phase detector 28 significantly changes in frequency, or during holdover recovery after re-acquiring an external synchronization reference.

In operation, phase locked loop 24 operates similarly to existing second order digital phase locked loops when the frequency of the reference signal remains fairly stable. When a relatively significant change in the frequency of the reference signal occurs, however, phase locked loop 24 achieves fast phase settling. An abrupt frequency change on the reference input to phase detector 28, or a re-appearance of this signal after a disruption (holdover recovery) may occur for several reasons. First, the frequency of the reference signal may change abruptly from one frequency to another frequency. For example, during the holdover recovery period, the reference signal may change frequency from a DC value (missing or non-existent) to the normal operating frequency of the reference signal. Second, the frequency of the selected reference signal may change when a different reference signal is selected using reference select circuit 26. Because different reference sources may have reference signals of different frequencies, an abrupt frequency change may occur simply by changing the reference source multiplexed through reference select circuit 26.

Referring again to FIGS. 2A, 2B and 2C the network element clock has acquired the new frequency at time $t_1$. The present invention seeks to maintain the phase difference between the reference signal and the network element clock (output of the phase locked loop) at time $t_1$. In many applications, such as in a SONET network element clock, the phase of the clock only needs to be locked relative to the phase of the reference signal. It is not required to be locked at a specific absolute phase difference. The present invention, therefore, adjusts the phase locked loop so as to maintain the relative phase difference between the reference signal and the network element output clock at a value equal to the phase difference that remains after the phase locked loop has acquired the new frequency of the reference signal.

For example, as illustrated by graph 20 in FIG. 2C, the present invention achieves the phase profile indicated by the dashed line 22 after time $t_1$. The present invention may thus achieve phase settling at approximately the same time that frequency acquisition has been achieved. Although there will be an absolute phase difference between the reference signal and the network element clock as with any phase-locked loop, the relative phase between the two signals will change only minimally after time $t_1$.

Upon a significant frequency change in the reference signal for phase locked loop 24, phase locked loop 24 first acquires the new frequency of the reference signal. Just prior to the frequency change, the loop output frequency is proportional to $N_{INT}$ and the phase detector error, $N_{ERR}$, will normally be zero, meaning that $N_{LIN}$ is also approximately zero. Then, the frequency change occurs. Because integral register 39 in integrator 32 is updated extremely slowly (long time constant), the phase error, $N_{ERR}$, starts to increase due to the frequency difference between the reference and feedback inputs to phase detector 28. As $N_{ERR}$ grows, so does the count $N_{LIN}$, which is summed with $N_{INT}$ to generate the output frequency register, $N_{TOT}$. When this sum has moved far enough such that $N_{TOT}$ now represents the new frequency of the input reference signal, the phase error, $N_{ERR}$, stops increasing and has reached its maximum. Because the absolute phase difference between the reference input and the output of phase locked loop 24 is frequently unimportant, this maximum phase error may be fixed to prevent a large slow phase movement on the output of phase locked loop 24 as the loop would normally cause integral register 39 to slowly move to a value that represents the output frequency, reducing the phase error $N_{ERR}$ toward zero. Although a relative phase difference will still exist between the reference input and phase locked loop output, the relative phase difference will be fixed, thus preventing phase drift. Additionally, counter 40 may be reset such that its output is closely aligned to a timing edge of the selected reference input at time $t_1$, thus reducing residual phase detector output error $N_{ERR}$.

In the embodiment of phase locked loop 24 illustrated in FIG. 3, acquisition detector 42 determines when the new frequency has been acquired. Acquisition detector 42 is implemented in software and waits a predetermined amount of time after the frequency change on the reference signal to indicate acquisition of the new frequency. More particularly, acquisition detector 42 waits between 9 and 10 linear time constants of phase locked loop 24 before indicating that the new frequency has been acquired. When the new frequency has been acquired, acquisition detector 42 generates an output signal indicating that acquisition is complete.

Rather than waiting a specific amount of time after the frequency change occurs, acquisition detector 42 could instead monitor the change in the output frequency count, $N_{TOT}$. Once phase locked loop 24 has acquired the new frequency, $N_{TOT}$ will change only slightly to correct phase errors. Accordingly, acquisition detector 42 could determine that frequency acquisition is complete by monitoring $N_{TOT}$ and determining when $N_{TOT}$ changes by less than a predetermined amount, per evaluation period.

As described above, the present invention achieves fast phase settling by fixing the phase difference between the reference signal and the output of phase locked loop 24 after the new frequency of the reference signal has been acquired. To understand how fast phase settling is achieved, it is important to understand the state of phase locked loop 24 after acquisition of the new frequency. Just after the new frequency has been acquired by phase locked loop 24, the output frequency register, $N_{TOT}$, will be approximately correct. Because integrator 32 responds slowly to frequency changes, however, its output, $N_{INT}$, will be substantially unchanged from its initial value and will be incorrect. Given the error in $N_{INT}$, $N_{TOT}$ is approximately correct only because phase detector 28 continues to generate a large error signal, $N_{ERR}$, causing proportional gain circuit 30 to produce a large output, $N_{LIN}$. The large value on $N_{LIN}$, then, compensates for the incorrect value of $N_{INT}$. If phase locked loop 24 was undisturbed at this point, $N_{INT}$ would slowly reach the correct value while $N_{LIN}$ and $N_{ERR}$ decreased to zero.

The steady state value that would eventually be reached by $N_{INT}$ would be approximately equivalent to the value of $N_{TOT}$ after frequency acquisition. The present invention, therefore, forces the output of integrator 32, $N_{INT}$, to the value of $N_{TOT}$ immediately following frequency acquisition, and resets counter 40 in such a way to minimize the output error of phase detector 28, or $N_{ERR}$. This operation forces phase locked loop 24 to a steady state such that the phase of the output signal will not drift significantly relative to the reference signal after this operation.

The phase detector output error may be further reduced toward zero by resetting the phase detector. This may be accomplished by latching the value of $N_{ERR}$ into a register at some point in time (the "reset"), and then subtracting this latched value from all future outputs of the phase detector until the next "reset" occurs. Thus, immediately after the "reset", the value of $N_{ERR}$ is subtracted from itself, giving zero output to any arbitrarily desired numerical resolution.

Integrator 32 includes integral register 39 that holds the output value, $N_{INT}$. The illustrated embodiment achieves fast phase settling by loading integral register 39 of integrator 32 with the contents of the output frequency register, $N_{TOT}$ of phase locked loop 24 following the frequency acquisition period. After acquisition detector 42 generates an output signal indicating that a new frequency has been acquired, load controller 44 generates a signal to multiplexer 37 to load the value, $N_{TOT}$ of output frequency register 34 into integral register 39. During normal operation, load controller 44 generates a signal to multiplexer 37 such that the output of summer 35 is loaded into integral register 39.

After integral register 39 is loaded with the value $N_{TOT}$, integrator 32 will produce a substantially correct steady state value at its output, $N_{INT}$. Accordingly, the phase detector output, $N_{ERR}$, should be forced to approximately zero at the same time or the proportional gain circuit 30 output, $N_{LIN}$, may cause an erroneous frequency change on the output of phase locked loop 24. Thus, when load controller 44 causes integral register 39 to be loaded with the output frequency count $N_{TOT}$, phase reset circuit 46 resets phase detector 28 and counter 40 such that phase detector 28 and counter 40 realign the feedback signal with the selected input reference signal. This is accomplished by either resetting counter 40 at a time such that the feedback signal is aligned with the selected reference, and/or setting the value of $N_{ERR}$, as the new phase detector zero (subtracting $N_{ERR}$ at that point from future phase detector counts). In the embodiment illustrated in FIG. 3, phase detector 28 is a window type phase detector. In such a phase detector, realignment may occur by recentering the window generated by the feedback signal from counter 40. The fixed relative phase difference existing at time $t_1$ in FIGS. 2A, 2B and 2C is thus defined as a zero phase difference at the output of phase detector 28. The present invention thus allows fast phase settling shortly after frequency acquisition.

The embodiment of phase locked loop 24 illustrated in FIG. 3 may be used to achieve fast phase settling during holdover recovery of network element clocks in SONET networks. During the holdover period, no reference signal is normally available to the reference input of phase detector 28. To aid in stabilizing the value of $N_{TOT}$ during the frequency acquisition phase of holder recovery, the update clock to integral register 39 can be disabled to prevent updating of integral register 39 of integrator 32. This allows $N_{TOT}$ to stabilize to the final correct value through feedback action, without an error in value from a slowly changing count $N_{INT}$ ($N_{INT}$ is held at the constant old value during frequency acquisition).

Although the present invention and its advantages have been described in detail, it should be understood that various changes, substitutions, and alterations can be made therein without departing from the spirit and scope of the invention as defined by the appended claims.

What is claimed is:

1. A method for achieving fast phase settling when a reference signal that is input to a phase locked loop changes from a first frequency to a second frequency, comprising:

acquiring said second frequency with said phase locked loop;

loading an integral register of an integrator of said phase locked loop with the contents of an output frequency register of said phase locked loop following said acquiring step, thereby forcing an output of the integrator to the value of the output frequency register and forcing the phase locked loop to a steady state wherein the phase difference between the reference signal and an output signal of the phase locked loop remains approximately constant; and realigning a phase detector of said phase locked loop to said reference signal.

2. The method of claim 1, further comprising:

preventing changes to said integral register between the change from said first frequency to said second frequency and the occurrence of said acquisition signal.

3. The method of claim 1 wherein said realigning step comprises resetting a phase detector such that its output error is reduced to zero.

4. The method of claim 1 wherein said realigning step comprises forcing said phase detector to output a signal indicating zero error.

5. The method of claim 1 wherein said acquiring step further comprises:

indicating that said second frequency has been acquired after a predetermined time following the change from said first frequency to said second frequency.

6. A method for achieving fast phase settling when a reference signal that is input to a phase locked loop changes from a first frequency to a second frequency, comprising:

acquiring said second frequency with said phase locked loop by:

comparing a first value and a second value of a voltage controlling the voltage controlled oscillator of said phase locked loop following the change from said first frequency to said second frequency; and indicating that said second frequency has been acquired when said first value differs from said second value by less than a predetermined amount;

loading an integral register of said phase locked loop with the contents of an output frequency register of said phase locked loop following said acquiring step; and realigning a phase detector of said phase locked loop to said reference signal.

7. A method for achieving fast phase settling when a reference signal that is input to a phase locked loop changes from a first frequency to a second frequency, comprising:

acquiring said second frequency with said phase locked loop and indicating that said second frequency has been acquired after a predetermined number of time constants of said phase locked loop;

loading an integral register of an integrator of said phase locked loop with the contents of an output frequency register of said phase locked loop following said acquiring step, thereby forcing an output of the integrator to the value of the output frequency register and forcing the phase locked loop to a steady state wherein the phase difference between the reference signal and an output signal of the phase locked loop remains approximately constant; and realigning a phase detector of said phase locked loop to said reference signal.

8. A method for achieving fast phase settling during clock holdover recovery in a synchronous optical network, comprising:

acquiring the frequency of a reference signal with a phase locked loop following holdover;

loading an integral register of said phase locked loop with the contents of an output frequency register of said phase locked loop following said acquiring step to force an approximately constant phase difference between the reference signal and an output signal of the phase locked loop; and resetting a phase detector of said phase locked loop.

9. The method of claim 8 wherein said reference signal comprises a network synchronization reference signal.

10. The method of claim 8, further comprising:

preventing changes to said integral register during holdover.

11. The method of claim 8, further comprising:

preventing changes to said integral register between the end of holdover and the occurrence of said acquisition signal.

12. The method of claim 8 wherein said realigning step comprises resetting a phase detector such that its output error is reduced to zero.

13. The method of claim 8 wherein said acquiring step further comprises:

indicating that said frequency has been acquired after a predetermined time following the end of holdover.

14. The method of claim 8, wherein said acquiring step further comprises:

comparing a first value and a second value of a voltage controlling the voltage controlled oscillator of said phase locked loop following the change from said first frequency to said second frequency; and indicating that said second frequency has been acquired when said first value differs from said second value by less than a predetermined amount.

15. The system of claim 8, wherein said acquisition circuit is further operable to:

compare a first value and a second value of a voltage controlling the voltage controlled oscillator of said phase locked loop following the change from said first frequency to said second frequency; and indicate that said second frequency has been acquired when said first value differs from said second value by less than a predetermined amount.

16. A method for achieving fast phase settling during clock holdover recovery in a synchronous optical network, comprising:

acquiring the frequency of a reference signal with a phase locked loop following holdover and indicating that said frequency has been acquired after a predetermined number of time constants of said phase locked loop;

loading an integral register of said phase locked loop with the contents of an output frequency register of said phase locked loop following said acquiring step to force an approximately constant phase difference between the reference signal and an output signal of the phase locked loop; and resetting a phase detector of said phase locked loop.

17. A SONET holdover recovery circuit, comprising:

a phase locked loop including a phase detector, an integral register, and an output frequency register;

an acquisition circuit operable to generate an acquisition signal when the frequency of a reference signal has been acquired with said phase locked loop following holdover;

a load controller operable to cause said integral register to be loaded with the contents of said output frequency register in response to said acquisition signal to force an approximately constant phase difference between the reference signal and an output signal of the phase locked loop; and a reset circuit operable to reset said phase detector, thereby fixing the phase difference between the reference signal and an output signal of the phase locked loop.

18. The SONET holdover recovery circuit of claim 17, further comprising:

a disabler circuit operable to prevent updating of said integrator counter during holdover.

19. The SONET holdover recovery circuit of claim 18 wherein said disabler circuit is further operable to prevent updating of said integral register between the end of holdover and the occurrence of said acquisition signal.

20. The SONET holdover recovery circuit of claim 17, wherein said phase detector, said reset circuit, said integral register, and said output frequency register are comprised of a microprocessor.

21. The SONET holdover recovery circuit of claim 17 wherein said acquisition circuit generates said acquisition signal for a predetermined time following holdover.

22. A SONET holdover recovery circuit, comprising:

a phase locked loop including a phase detector, an integral register, and an output frequency register;

an acquisition circuit operable to generate an acquisition signal for a predetermined number of time constants of the phase locked loop when the frequency of a reference signal has been acquired with said phase locked loop following holdover;

a load controller operable to cause said integral register to be loaded with the contents of said output frequency register in response to said acquisition signal to force an approximately constant phase difference between the reference signal and an output signal of the phase locked loop; and a reset circuit operable to reset said phase detector, thereby fixing the phase difference between the reference signal and an output signal of the phase locked loop.

* * * * *